(12) United States Patent
Hu et al.

(10) Patent No.: US 11,513,444 B2
(45) Date of Patent: *Nov. 29, 2022

(54) NOISE REDUCTION FOR OVERLAY CONTROL

(71) Applicant: Taiwan Semiconductor Manufacturing Co., Ltd., Hsin-Chu (TW)

(72) Inventors: Weimin Hu, Hsinchu (TW); Yang-Hung Chang, Taipei (TW); Kai-Hsiung Chen, New Taipei (TW); Chun-Ming Hu, Hsin-Chu (TW); Chih-Ming Ke, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 16/901,278

(22) Filed: Jun. 15, 2020

(65) Prior Publication Data

US 2020/0310255 A1    Oct. 1, 2020

Related U.S. Application Data

(60) Continuation of application No. 16/402,828, filed on May 3, 2019, now Pat. No. 10,684,556, which is a division of application No. 15/644,126, filed on Jul. 7, 2017, now Pat. No. 10,281,827.

(60) Provisional application No. 62/435,009, filed on Dec. 15, 2016.

(51) Int. Cl.
    *G03F 7/20*    (2006.01)

(52) U.S. Cl.
    CPC .......... *G03F 7/70633* (2013.01); *G03F 7/705* (2013.01)

(58) Field of Classification Search
    CPC .. G03F 7/70633; G03F 7/70683; G03F 7/705; G03F 7/70675
    See application file for complete search history.

(56) References Cited

U.S. PATENT DOCUMENTS

| | | |
|---|---|---|
| 8,716,841 B1 | 5/2014 | Chang et al. |
| 8,736,084 B2 | 5/2014 | Cheng et al. |
| 8,796,666 B1 | 8/2014 | Huang et al. |
| 8,837,810 B2 | 9/2014 | Chen et al. |
| 9,093,530 B2 | 7/2015 | Huang et al. |
| 9,134,633 B2 | 9/2015 | Lin et al. |
| 9,230,867 B2 | 1/2016 | Cheng et al. |
| 9,304,403 B2 | 4/2016 | Lin et al. |
| 9,404,743 B2 | 8/2016 | Chiu et al. |
| 9,548,303 B2 | 1/2017 | Lee et al. |

(Continued)

*Primary Examiner* — Hung V Nguyen
(74) *Attorney, Agent, or Firm* — Haynes and Boone, LLP

(57) ABSTRACT

The present disclosure provides a system. The system includes a metrology tool configured to collect overlay errors from a patterned substrate; and a controller module coupled to the metrology tool and configured to generate an overlay compensation from the collected overlay errors, wherein the generating of the overlay compensation includes identifying a portion of the overlay errors as a set of outliers, identifying inside the set of outliers overlay errors not due to reticle effects, thereby creating a set of noise, excluding the set of noise from overlay errors, thereby creating a set of filtered overlay errors, and calculating the overlay compensation based on the set of filtered overlay errors.

20 Claims, 7 Drawing Sheets

(56) References Cited

U.S. PATENT DOCUMENTS

| | | |
|---|---|---|
| 10,281,827 B2 | 5/2019 | Hu et al. |
| 10,649,447 B2 * | 5/2020 | Izikson ............. H01L 21/67288 |
| 10,684,556 B2 * | 6/2020 | Hu ...................... G03F 7/70633 |
| 2004/0038455 A1 | 2/2004 | Seligson et al. |
| 2016/0062250 A1 | 3/2016 | Hung et al. |
| 2017/0193153 A1 | 7/2017 | Liou et al. |

* cited by examiner

NOISE REDUCTION FOR OVERLAY CONTROL

PRIORITY

This is a continuation application of U.S. patent application Ser. No. 16/402,828, filed May 3, 2019, which is a divisional application of U.S. patent application Ser. No. 15/644,126, filed Jul. 7, 2017, which claims the benefits of U.S. Prov. App. No. 62/435,009 entitled "Noise Reduction for Overlay Control," filed Dec. 15, 2016, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

With small feature sizes in advanced technology nodes, control of semiconductor fabrication processes faces many challenges. In a semiconductor fabrication facility, monitoring the results of process steps has become critical. Misalignment, lithography defects, and tool drift can cause unsatisfactory results in a process even after a period of time with satisfactory results. Overlay monitoring and control becomes crucial to minimize overlay errors. Non-systematic imperfections, such as dust particles, overlay mark asymmetry, or overlay mark damages, may cause large overlay errors, often referred to as "noise." Noise degrades accuracy in overlay control. It is desirable to have techniques that can reduce or filter out the noise during process overlay control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
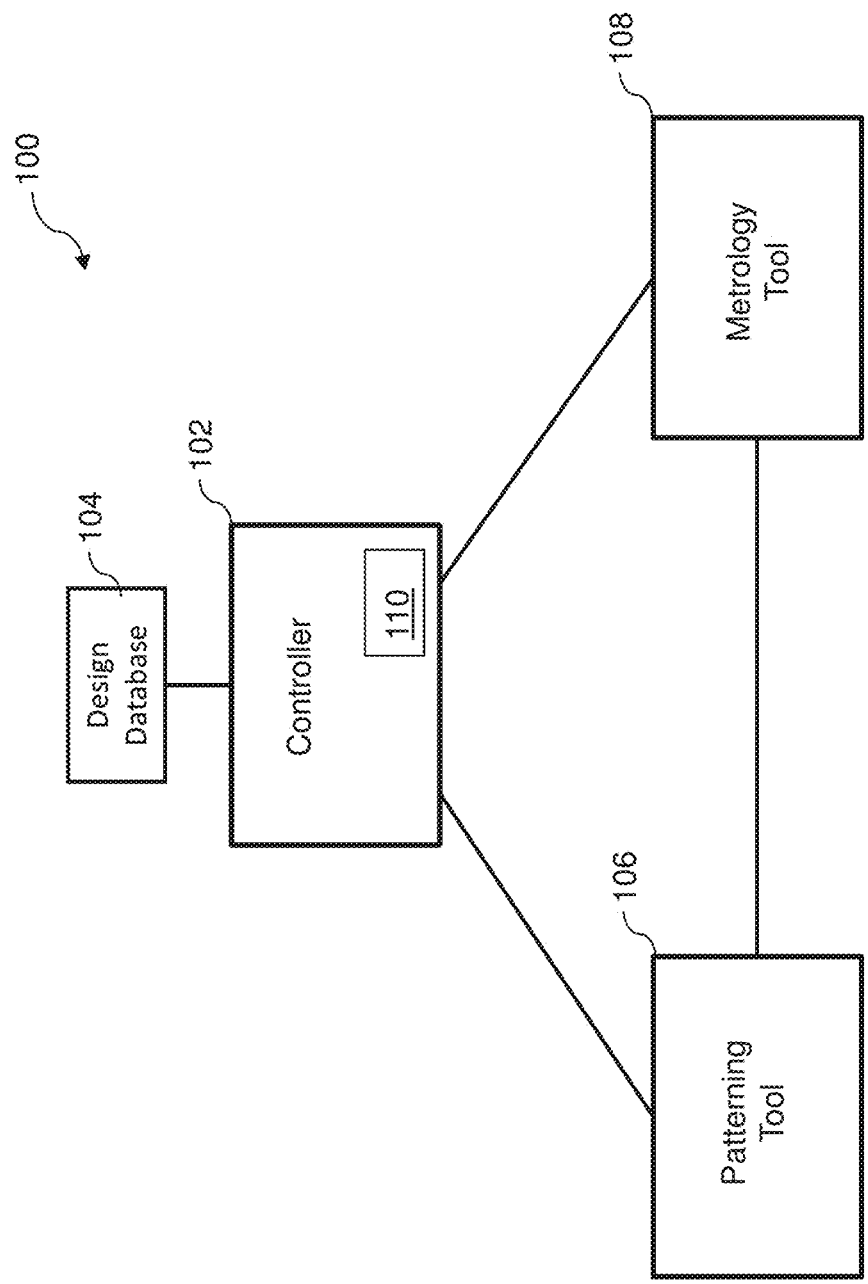
FIG. 1A is a block diagram of a system for overlay monitoring and control constructed in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to overlay monitoring and control to ensure alignment quality of one or more semiconductor layers, more particularly to noise reduction to increase overlay correction accuracy. Overlay monitoring and control are used at various steps during semiconductor manufacturing processes. For example, a metrology tool can measure overlay errors by performing an overlay measurement on a work piece (e.g., a semiconductor wafer). An overlay measurement generally indicates how accurately a first patterned layer aligns with a second patterned layer disposed above or below it or how accurately a first pattern aligns with a second pattern disposed on the same layer. The overlay error is typically determined with an overlay mark having structures formed on one or more layers. The structures may take the form of gratings, box-in-box, or other suitable shapes. If the two layers or patterns are properly formed, then the structure on one layer or pattern tends to be aligned relative to the structure on the other layer or pattern. Otherwise, the structure on one layer or pattern tends to be offset or misaligned relative to the structure on the other layer or pattern. The overlay error is the misalignment between the corresponding structures.

Moreover, if a measured overlay error is unacceptable (e.g., out of a predetermined range), the overlay metrology may be used to alter one or more parameters of the process such that additional wafers manufactured by the process can have acceptable characteristics. For example, measured overlay errors may be fed into an analysis routine that calculates adjustable parameters, which may be used by a controller to improve the alignment of the lithography tool used in the wafer processing.

Therefore, it is desirable to measure overlay errors of a set of overlay marks as accurately as possible. Inaccuracy in a given set of overlay metrology measurements may arise from non-systematic imperfections. Such non-systematic imperfections may include dust particles on wafer surface, overlay mark asymmetry, and overlay mark damages in a material layer (e.g., damages caused by chemical-mechanical polishing). These non-systematic imperfections may lead to relatively sizeable inaccuracies in the overlay measurement, with an appearance of a plurality of outliers among measured overlay errors. Such outliers are also referred to as "noise" throughout the present disclosure. As a result, it is desirable to provide a system and method suitable for noise reduction in overlay monitoring and control, mitigating the impact of overlay measurement inaccuracies.

FIG. 1A is a block diagram illustrating a system 100 for implementing a method for overlay monitoring and control according to various aspects of the present disclosure. It is understood that other configurations and inclusion or omission of various items in the system 100 may be possible. The system 100 is exemplary, and is not intended to limit the disclosure beyond what is explicitly recited in the claims. The system 100 includes a controller 102, a patterning tool 106, and a metrology tool 108. The controller 102 is coupled with the patterning tool 106 and the metrology tool 108. In some embodiments, the patterning tool 106 is also coupled with the metrology tool 108.

The controller 102 controls the operation of the patterning tool 106 and retrieves metrology readings from the metrology tool 108 for further processing. In some embodiments, the controller 102 includes an overlay control module 110. The overlay control module 110 is able to generate overlay compensation, determine a set of adjustable parameters based on overlay measurement results, and feed forward to the patterning tool 106 for alignment adjustment. The overlay control module 110 may perform statistical analysis of overlay errors. For example, the overlay control module 110 may calculate overlay correction maps using overlay errors from previous measurements from a single or a plurality of wafers in one lot, or in a plurality of lots. The overlay control module 110 may further remove noise from overlay errors before generating overlay correction maps based on applying one or more noise filtering algorithms, thereby improving overlay correction accuracy. In some embodiments, the controller 102 is implemented in a computer, including a processor, memory, and an interface. The controller 102 may be implemented in a single computer or a distributed computer, and connects to various components of the patterning tool 106 and the metrology tool 108, including but not limited to the connections shown in FIG. 1A. In some embodiments, the controller 102 includes one or more software programs for processing metrology data, such as overlay errors.

The system 100 may also include an integrated circuit (IC) design database 104 coupled to the controller 102. The IC design database 104 is designed to store and manage IC design layout data. In some embodiments, the IC design database 104 includes a plurality of IC design layouts which include IC layout patterns. The IC layout patterns will be transferred onto a semiconductor wafer using a mask (or reticle) and the patterning tool 106 to form various circuit components on the wafer. The circuit components may include transistors, capacitors, resistors, and/or metal lines. In some embodiments, the design database may be integrated in the controller 102.

In various embodiments, a plurality of metrology data is collected from different positions on the wafer. The controller 102 may use information (e.g., process parameters) from the design database 104 and the patterning tool 106 to generate a metrology sampling plan, determining the number and positions of overlay marks to collect metrology data. These overlay marks are patterned on the mask and then transferred to a material layer (e.g., a resist layer) on the wafer during patterning. Each metrology data includes information such as overlay error and/or other measureable parameters, such as widths, heights, critical dimensions, and thickness. In some embodiments, overlay errors are measured by comparing misalignment of overlay marks in a resist layer with overlay marks formed in a previous patterned material layer. In some embodiments, overlay errors are measured by comparing the positions of the predetermined overlay marks and the corresponding marks on a resist pattern formed during exposure. Overlay errors collected from the wafer can be combined to form an overlay error map. An overlay compensation, also referred to as overlay correction, may be generated based on the overlay error map to adjust some adjustable process parameters of the patterning tool 106, so that overlay errors may be reduced in future patterning processes. For example, an overlay correction may indicate a linear model showing a linear increasing or decreasing trend along a certain direction. The patterning tool 106 may be adjusted to compensate for the previously discovered trend.

Figure 1B:
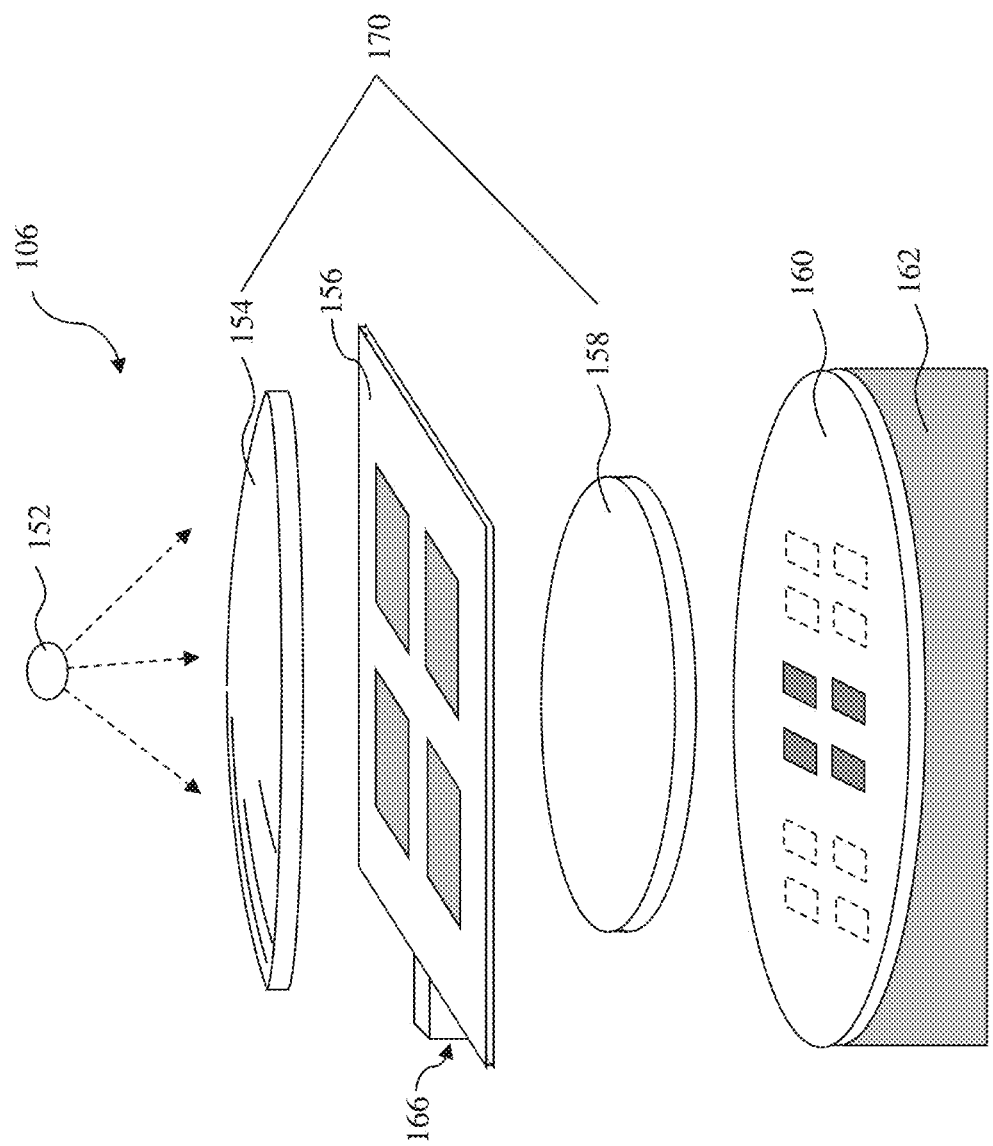
FIG. 1B is a schematic diagram of an exposing tool constructed in accordance with some embodiments of the present disclosure.

The patterning tool 106 of FIG. 1A is further described in detail with reference to FIG. 1B in a schematic view. The patterning tool 106 is operated during a procedure of patterning a substrate 160. In the present embodiment, the patterning tool 106 is a lithography system (also referred to as the lithography system 106) and the substrate 160 is a semiconductor wafer, such as a silicon wafer, or other suitable wafer to be patterned. The lithography system 106 is operable to expose a resist layer coated on the substrate 160. In some embodiments, the lithography system 106 includes a radiation source (illumination source) 152 to generate radiation energy (or radiation beam) to expose the resist layer. The radiation source 152 may be any suitable light source. In various embodiments, the radiation source may include a light source selected from the group consisting of ultraviolet (UV) source, deep UV (DUV) source, and EUV source. For example, the radiation source 152 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source has a wavelength of about 13.5 nm or less.

The lithography system 106 also includes an optical subsystem 170 that receives radiation energy from the radiation source 152, modulates the radiation energy through a mask 156, and directs the radiation energy to the resist layer coated on the substrate 160. In some embodiments, the optical subsystem 170 includes an illumination module 154 and a projection module 158. In some embodiments, the optical subsystem 170 is designed to have a refractive mechanism. In such situation, the optical subsystem includes various refractive components, such as lenses.

The illumination module 154 may include a single lens or a lens module having multiple lenses and/or other lens components. For example, the illumination module 154 may include microlens arrays, shadow masks, and/or other structures designed to aid in directing the radiation energy from the radiation source 152 onto the mask 156 that defines a pattern to be transferred to a resist layer coated on the substrate 160.

The mask 156 is loaded and secured on a mask stage 166. The mask stage 166 is designed and configured to be operable for translational and rotational motions. The mask 156 has a pattern to be transferred to the substrate 160. The pattern of the mask 156 may include a plurality of predetermined overlay marks used in the following overlay monitoring and control process. In some embodiments, the mask 156 includes a substrate and a patterned layer formed on the substrate. In some embodiments, the mask 156 includes a transparent substrate and a patterned absorption layer. The transparent substrate may use fused silica ($SiO_2$) relatively free of defects, such as borosilicate glass and soda-lime glass. The transparent substrate may use calcium fluoride and/or other suitable materials. The patterned absorption layer may be formed using a plurality of processes and a plurality of materials, such as depositing a metal film made with chromium (Cr), or other suitable material, such as MoSi. A light beam may be partially or completely blocked when directed on an absorption region. The absorption layer may be patterned to have one or more openings through which a light beam may travel without being absorbed by the absorption layer. The mask 156 may incorporate other resolution enhancement techniques such as phase shift mask (PSM) and/or optical proximity correction (OPC).

The projection module 158 may have a single lens element or a plurality of lens elements configured to provide proper illumination to the resist layer coated on the substrate 160. Each lens element may include a transparent substrate and may further include a plurality of coating layers. The optical subsystem 170 may further include additional components such as an entrance pupil and an exit pupil to form an image of the mask 156 on the substrate 160 secured on a substrate stage 162, which is capable of securing and moving the substrate 160 in translational and rotational modes.

In other embodiments where the radiation energy is EUV energy, the mask 156 and the optical subsystem 170 are designed to have a reflective mechanism. In this situation, the optical subsystem 170 includes various reflective components, such as mirrors, designed and configured to achieve the respective functions. The mask 156 has a reflective structure. In one example for illustration, the mask 156 includes a substrate with a low thermal expansion material (e.g., $TiO_2$ doped $SiO_2$), a multiple reflective multiple layers (ML) deposited on the substrate where the ML includes a plurality of film pairs (e.g., molybdenum-silicon film pairs), and an absorption layer (e.g., a tantalum boron nitride layer) deposited over the ML. The absorption layer is patterned according to an IC design layout.

Referring back to FIG. 1A, the metrology tool 108 is designed to collect metrology data, including overlay errors, from predetermined locations of a substrate. In some embodiments, the metrology tool 108 receives a semiconductor wafer with a resist pattern on it, performs an overlay measurement of the resist pattern to obtain overlay errors from overlay marks at predetermined locations, and subsequently send measurement results to the controller 102 for further processing, for example, in the overlay control module 110.

The system 100 is described according to various embodiments. However, in various embodiments, the various modules of the system 100 may be integrated together. For example, although FIG. 1A illustrates the metrology tool 108 separated from the patterning tool 106, the metrology tool 108 may be integrated into the patterning tool 106 in any suitable configuration. In some embodiments, the various modules of the system 100 may be distributed in different locations and coupled together through intranet or internet. In some embodiments, various functions may be built in different modules. For example, the overlay control module 110 may be integrated in the controller 102 or in the metrology tool 108.

Figure 2:
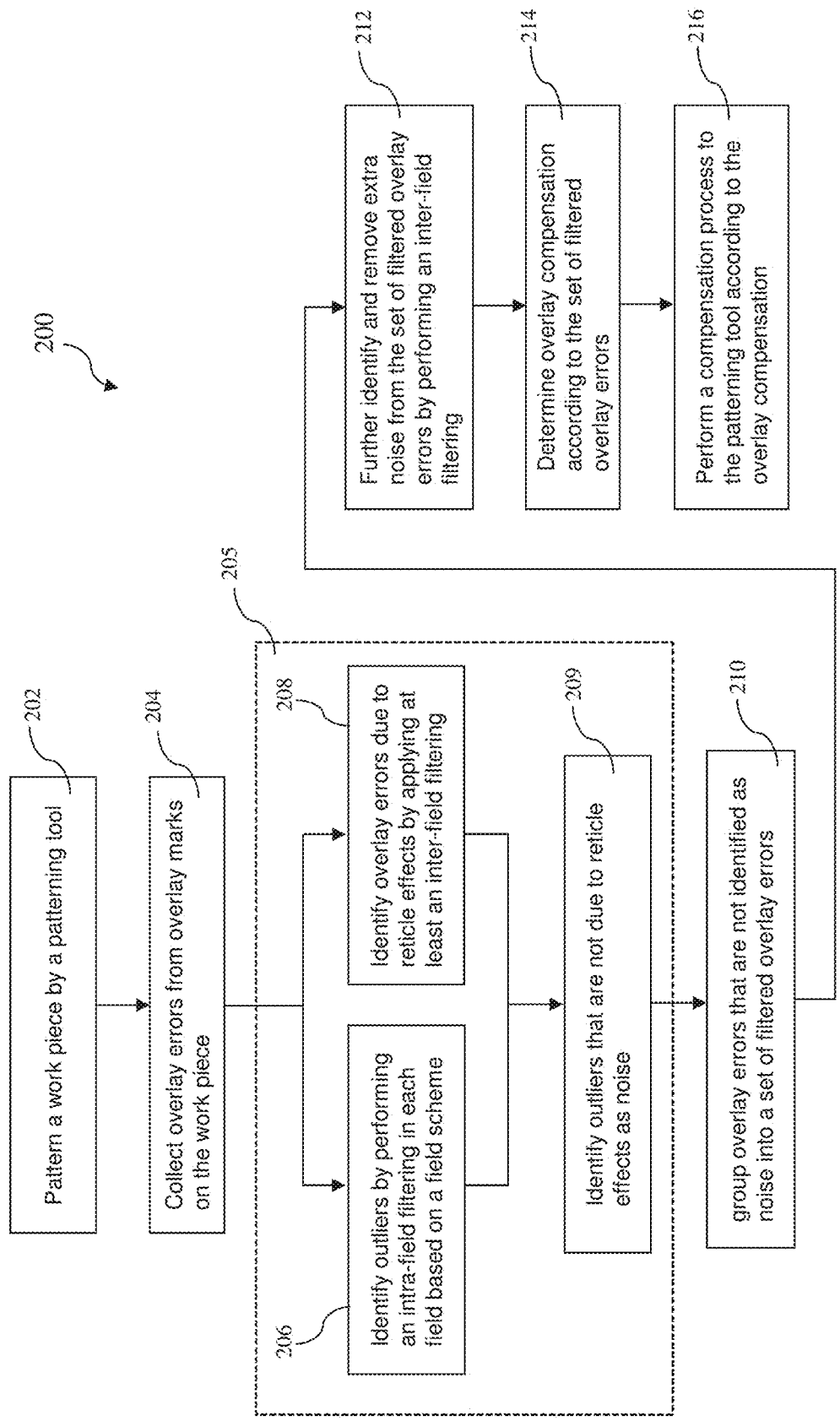
FIG. 2 is a flowchart of a method of semiconductor fabrication process control in accordance with some embodiments of the present disclosure.

FIG. 2 is a flowchart of a method 200 for fabricating a semiconductor structure and overlay monitoring and control associated therewith, constructed in accordance with various embodiments. In some embodiments, the method 200 is implemented using the system 100 as shown in FIGS. 1A and 1B. It is understood that additional steps can be provided before, during, and after the method 200, and some steps described can be replaced, eliminated, or moved around for additional embodiments of the method 200. The method 200 is an example, and is not intended to limit the disclosure beyond what is explicitly recited in the claims.

Figure 3:
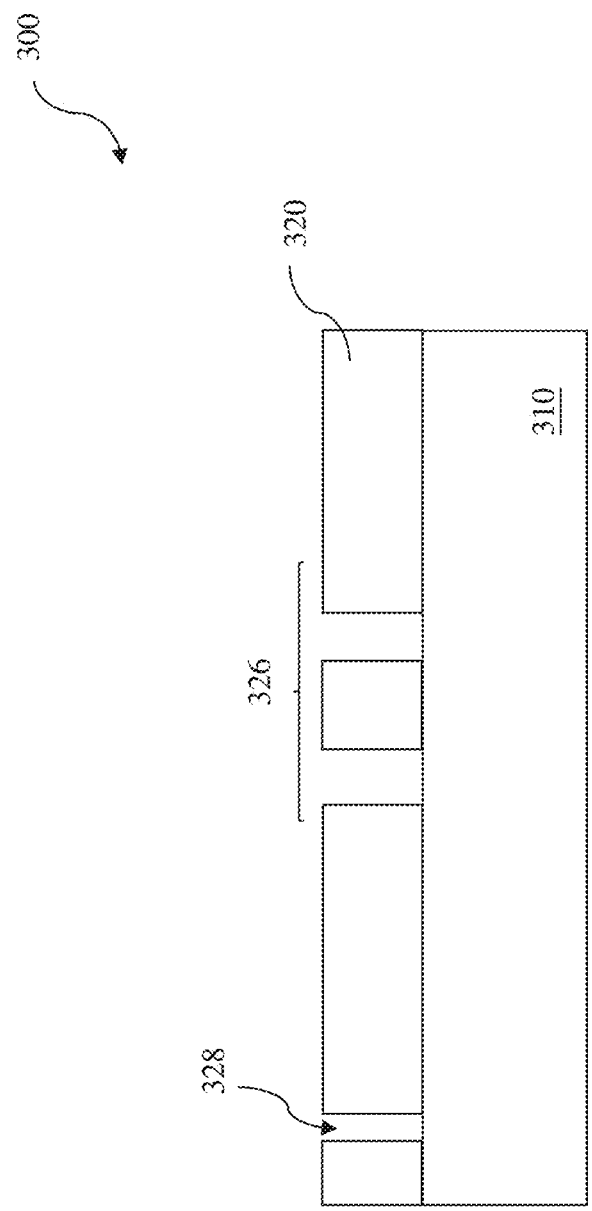
FIG. 3 is a sectional view of a substrate constructed in accordance with some embodiments of the present disclosure.

The method 200 includes an operation 202 by patterning a work piece (e.g., a semiconductor wafer) by a patterning tool, such as the patterning tool 106. The method 200 is thereafter described with reference to FIGS. 3, 4, and 5. FIG. 3 illustrates an exemplary semiconductor structure 300 in a sectional view, constructed in accordance with some embodiments. The semiconductor structure 300 includes a substrate 310 and a material layer 320 on the substrate 310. The operation 202 forms multiple patterns in the material layer 320. In some embodiments, the substrate 310 is a semiconductor substrate, such as silicon substrate or a substrate having other semiconductor material (e.g., silicon germanium). Alternatively, the substrate 310 is a photomask (mask or reticle), or other suitable substrates, such as a thin-film-transistor liquid crystal display (TFT-LCD) substrate.

After patterning, the material layer 320 includes a main pattern 326 having various main features. The main pattern 326 is defined according to features of an IC. The material layer 320 also includes various overlay marks 328 designed for overlay inspection and alignment monitoring. The material layer 320 may be a semiconductor material layer (e.g., silicon layer or silicon germanium layer), a dielectric material (e.g., an interlayer dielectric-ILD), a conductive material (e.g., metal layer or a doped polysilicon layer) or a resist material (e.g., photoresist material) in various embodiments. The main pattern 326 may include a doping pattern (e.g., various source and drain features formed in a semiconductor material layer), a gate electrode pattern (having multiple gate electrodes of polysilicon or metal), or an interconnect pattern having a plurality of conductive features (e.g., contacts, vias, or metal lines) in various embodiments. In some embodiments, the structure 300 is a test structure (e.g., a test wafer or a control wafer) patterned with mainly overlay marks 328 but without main pattern 326 formed together. The material layer 320 is patterned by a suitable technology (e.g., lithography patterning). In the present embodiment, material layer 320 is a resist layer patterned by a lithography system. The resist layer is coated on the substrate 310 by a proper technique, such as spin-on coating. The resist layer is sensitive to the radiation beam during a lithography exposing process and is resistive to a subsequent process (e.g., etching or ion implantation). The resist layer may be positive-tone resist or negative-tone resist. The operation 202 may further include other processing steps, such as a thermal baking step to reduce solvent of the resist layer after the spin-on coating.

Figure 4:
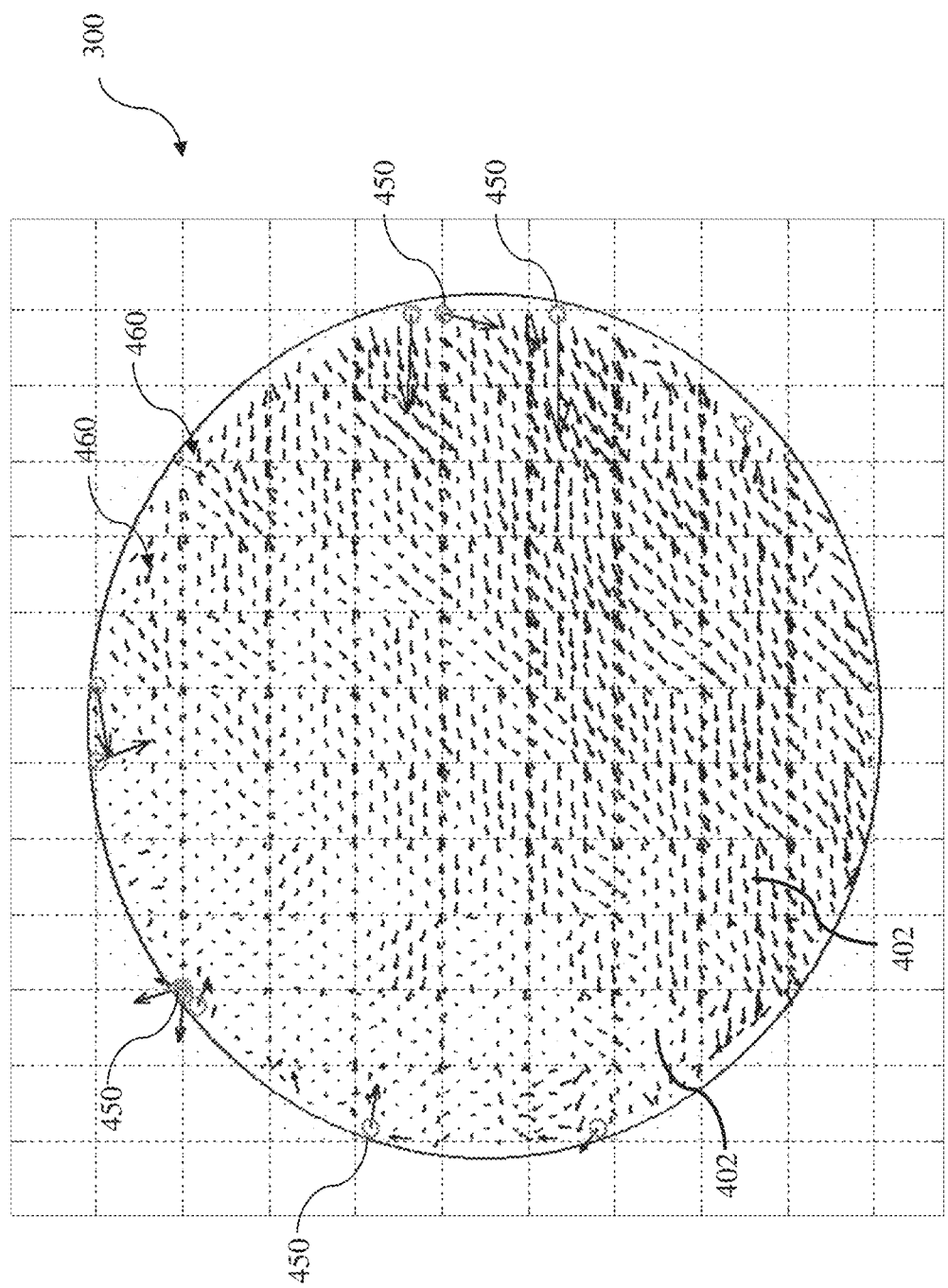
FIG. 4 illustrates a wafer map with overlay error vectors depicted on top of a visual representation of the wafer in accordance with some embodiments of the present disclosure.

The semiconductor structure 300 is further described with a reference to FIG. 4. In the present embodiment, the substrate 310 is a semiconductor wafer (e.g., a silicon wafer). FIG. 4 illustrates a top view of a wafer with overlay errors depicted on top of a visual representation of the wafer. The top view is also referred to as a wafer map. A wafer goes through a plurality of IC fabricating operations, thereby forming multiple chips (dies) on the wafer. Each chip includes a functional integrated circuit. A wafer further includes scribe lines defined between the chips. The chips are separated by dicing through the scribe lines at a later fabrication stage.

From a top view, the wafer comprises many exposure fields 402. During lithography patterning, patterns defined on a mask are repeatedly transferred to each field of the wafer. Particularly, the lithography patterning process includes an exposing process in a proper mode, such as step and scan. The mask is stepped to a field of the wafer and the corresponding mask patterns are transferred to that field, and then the mask is stepped to a next field and the mask patterns are transferred to the field, and so on until the fields of the wafer are exhausted. Each step to a field requires machine-alignment. In some embodiments, each field 402 includes one chip or alternatively multiple chips. In various embodiments, overlay marks are formed on each field. For example, overlay masks are formed on chip areas and/or on scribe lines. The number overlay marks and the positions of overlay marks are designed to have sufficient coverage of the wafer from field to field and/or from chip to chip.

Referring to FIGS. 2 and 4, method 200 proceeds to operation 204 by collecting metrology data on the current wafer, such as measuring displacement of overlay marks. Metrology data may be obtained from each overlay mark on the wafer, or alternatively only from overlay marks at selected positions predetermined by a metrology sampling plan. Metrology data include information about overlay errors. Each overlay error can be represented using a vector including a magnitude and a direction. A plurality of overlay error vectors obtained can be depicted on the wafer map, forming an overlay error map. FIG. 4 also illustrates an overlay error map showing overlay error vectors collected from the wafer 300, such as overlay error vectors 450 and 460. The difference between overlay error vectors 450 and 460 will be described in more details below.

Factors causing overlay errors have become increasingly complicated with reduction of feature size in IC circuits. The principle factors are due to systematic imperfections, including operational environment issues (e.g., vibration and/or temperature variation), stepper problems (e.g., optical alignment, wafer clamping, and/or wafer table errors), reticle inaccuracy (e.g., reticle in-plane distortion and/or reticle clamping), process inconsistency (e.g., during exposure, development, and/or etching), and wafer distortion (e.g., wafer flatness and/or pattern slip). Systematic imperfections are generally referred to as reticle effects.

Reticle effects may appear systematically wafer-to-wafer or lot-to-lot. It is desirable to compensate reticle effects to improve alignment quality in subsequent patterning operations. Reticle effects can be compensated to some extent by overlay correction. A correction model may be utilized to determine overlay correction that is associated with one or more adjustable process parameters of the patterning tool 106. The overlay correction is then applied to the patterning tool 106. In some embodiments, the overlay correction is associated with the optical subsystem 170 (such as the projection module 158 in FIG. 1B) and is applied to adjust the optical subsystem 170 accordingly in order to eliminate or reduce the overlay errors during subsequent exposing processes. For example, the overlay correction is applied to the projection module 158 such that the various optical components (such as lens or mirrors) are tuned with a configuration resulting in an imaging of the mask pattern to the wafer with decreased overlay errors. In one particular example, the compensation parameters are one or more optical parameters, such as one or more coefficients of the Zernike polynomial associated with the projection module 158.

Besides reticle effects, some other factors causing overlay errors include non-systematic imperfections, such as large size dust particles right over overlay marks, overlay mark asymmetry, and overlay mark damages on a wafer surface. As an example, an overlay mark in a material layer may have pattern damages during a chemical-mechanical polishing process, an etching process, or the like. As another example, an overlay mark may have an asymmetric feature after developing. Non-systematic imperfections occur randomly and do not carry consistent characteristics wafer-to-wafer or lot-to-lot. But they do cause inaccuracy in metrology tool's measurements, resulting in overlay error values that do not represent a true physical misalignment. In an overlay error map, overlay error vectors due to non-systematic imperfections typically appear as random outliers among a set of vectors, also referred to as "noise" in the present disclosure. Noise represents an unreliable overlay error. Still referring to FIG. 4, vectors 460 are examples of overlay error vectors due to reticle effects, while vectors 450 are examples of overlay error vectors identified as noise (highlighted by circling vector starting points for sake of clarity). According to the sources of overlay errors, corresponding metrology data (or overlay data) can be categorized as reticle effect data (non-noise data) or non-reticle effect data (noise data).

Since overlay correction is calculated based on overlay errors. The quality of a set of measured overlay errors is important for the accuracy of overlay correction. Particularly, noise should be filtered out of the valid data. Otherwise, a correction calculated at the location of noise may cause even larger overlay error in subsequent processes. Further, noise usually appears as an outlier. To compensate an outlier, compromise usually has to be made to nearby locations of non-noise data that represent real reticle effects. Overall, this leads to degraded correction accuracy.

Figure 5:
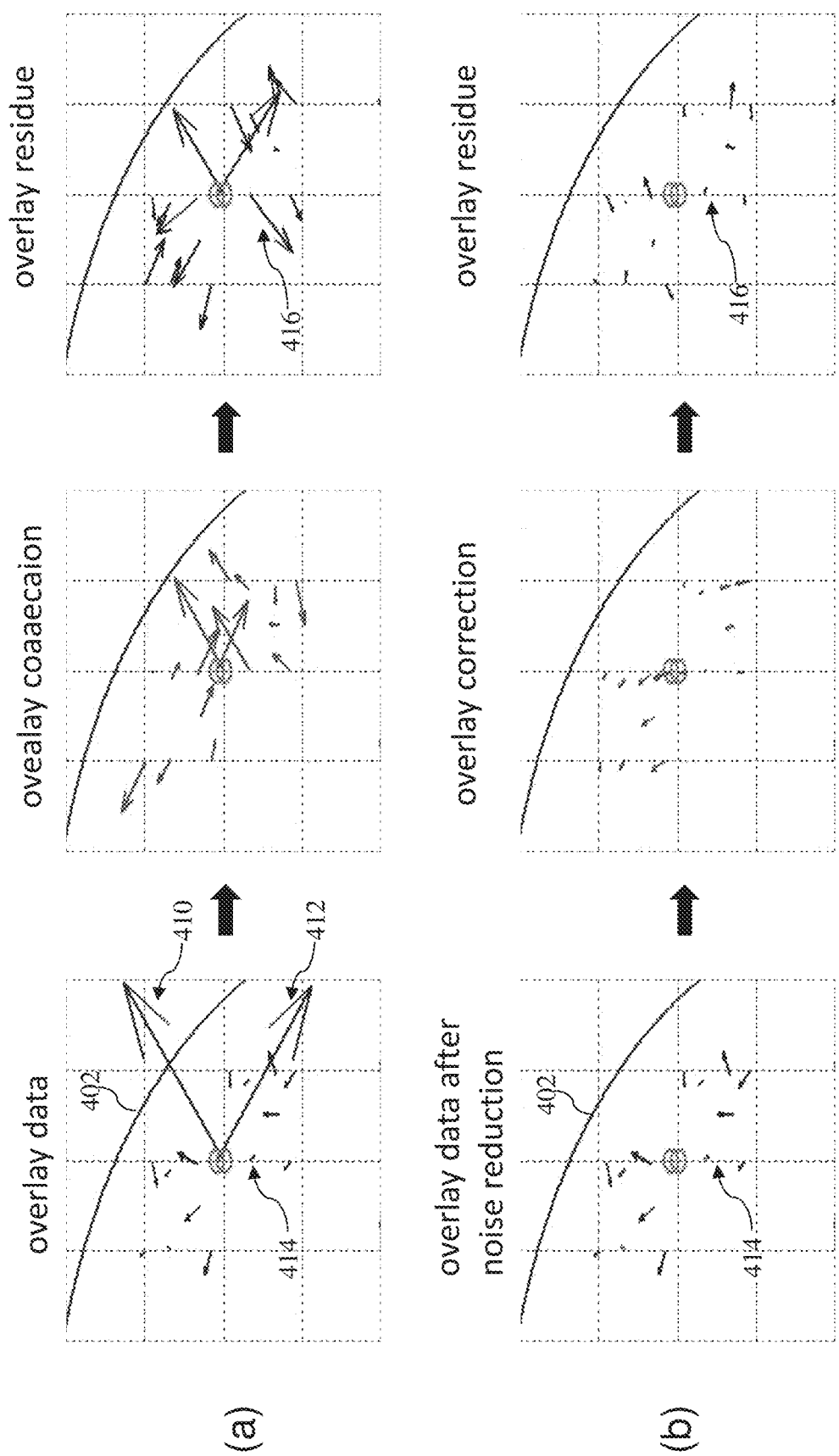
FIG. 5 shows a portion of a wafer map illustrating overlay correction that benefits from noise reduction in accordance with some embodiments of the present disclosure.

FIG. 5 illustrates the effectiveness of applying a noise reduction according to some embodiments of the present disclosure by comparing two processes, process (a) and process (b). Only a portion of a wafer map is illustrated in FIG. 5 for the sake of simplicity.

Process (a) illustrates overlay correction when no noise reduction is performed. Contour line 402 represents the edge of a wafer. Overlay errors are represented by a set of vectors. In this example, vectors 410 and 412 are noise, for example, due to overlay mark damages in corresponding spot(s) in a resist layer. Therefore, they have unreliable overlay error values. The other vectors (e.g., vector 414) represent overlay error caused by reticle effects. When the vectors 410 and 412 are used together with other vectors by a correction model to calculate an overlay correction, the correction calculated would have a poor accuracy. Moreover, overlay correction for nearby vectors would have to be compromised for the correction of these outliers. For example, after an overlay correction operation, an overlay correction result (referred to as an overlay residue) 416 corresponding to vector 414, which originally has insignificant overlay error magnitude, becomes much larger than vector 414 itself.

Process (b) illustrates an overlay correction operation with vector 410 and 412 identified as noise and removed from overlay data according to some embodiments of the present disclosure before an overlay correction model is applied. Without distortion from the noise, overlay correction is more accurate and overlay residue is significantly reduced compared with process (a).

Referring to FIG. 2, method 200 proceeds to operation 205 by identifying noise from the overlay errors. In the present embodiment, the operation 205 includes steps 206, 208, and 209 to identify noise by applying at least two quantitative filtering processes. These steps may be operated automatically. Alternatively, the operation 205 may rely on a manual procedure, such as a visual inspection conducted by an operator based on experience, to pick out noise from the overlay errors. It should be recognized that the identifying and the subsequent removal of noise before an overlay correction calculation is advantageous as it puts larger weight in the calculation on those overlay data having a larger degree of reliability, thereby improving the correction's quality.

Still referring to FIG. 2, Step 206 uses a quantitative analysis to identify outliers among overlay data in each field based on a field scheme of the device 300. In some embodiments, the field scheme is the same as the exposure field scheme. Since each quantitative analysis is operated on overlay data collected in the same field, the quantitative analysis can be regarded as an "intra-field filtering."

The overlay control module 110 may be programmed to automatically identify outlier based on one of the conditions listed below or a combination thereof:

i) magnitude of overlay vectors exceeding a selected level;

ii) a selected percentage of the most outlying overlay data points (e.g., defining the largest 5% of overlay data as being outlying);

iii) a statistical distribution based on mean and standard deviation (e.g., defining overlay data with magnitude outside of 6-sigma as being outlying); and iv) a relative magnitude variation.

In the present embodiment, the intra-field filtering compares the magnitude of a target data to that of a reference overlay data and considers an abrupt change in magnitude as being outlying. For example, the intra-field filtering may be executed by first sorting vectors in each field according to corresponding magnitudes. The vector magnitudes are denoted from small to big (or big to small) as $S_1, S_2, \ldots S_n$. An overlay data is picked as a reference point, such as $S_{n-k}$. Outliers are identified in conditions of $$S_n > S_{n-k} \cdot \left[(C_{max} - C_{min})e^{-R \cdot S_{n-k}} + C_{min}\right] \quad \text{eq (1)}$$

$$S_{n-1} > S_{n-k} \cdot \left[(C_{max} - C_{min})e^{-R \cdot S_{n-k}} + C_{min}\right]$$

$$\vdots$$

$$S_{n-k+1} > S_{n-k} \cdot \left[(C_{max} - C_{min})e^{-R \cdot S_{n-k}} + C_{min}\right]$$

where: $k = 1\sim5$, $C_{max} = 5\sim10$,

-continued $C_{min} = 0\sim5$, $R = 0.1\sim0.9$.

This quantitative analysis picks an overlay data as a reference point, such as $S_{n-k}$. The value of k depends on how many points a user wants to check in a field, while $$S_{n-k} \cdot [(C_{max} - C_{min})e^{-R \cdot S_{n-k}} + C_{min}]$$

can be regarded as a threshold defined by the picked reference point. Then the quantitative analysis compares each overlay data in the same field that has a magnitude larger than $S_{n-k}$ to this threshold. If a magnitude is larger than the threshold, it means the corresponding overlay data has a relatively large deviation in its vector magnitude from the reference overlay data and would thereby be identified as an outlier. For example, if thirty overlay data are collected from a field (n=30), and the overlay control module 110 (or a user) determines that four points need to be checked (k=4) according to some empirical knowledge, then $S_{26}$ (n-k=26) is selected as the reference point, and $S_{27}$, $S_{28}$, $S_{29}$, $S_{30}$ are compared individually to the threshold defined by $S_{26}$. If $S_{29}$ and $S_{30}$ are larger than the threshold, then these two overlay data are flagged as outliers. While $S_{27}$ and $S_{28}$ have larger vector magnitude than $S_{26}$, they are not identified as outliers in this example as their relative magnitude deviation from the reference overlay data is not considered as an abrupt change. This operation is subsequently applied to a plurality of other fields to identify outliers in each corresponding field.

The operation 205 also includes a step 208 to identify reticle effect data. With step 206, outliers are identified in each field. But an outlier is not necessarily a noise. For example, similar outliers that periodically appear in a plurality of fields may be related to some systematic imperfections and thus should be treated as useful data instead of noise.

Figure 6:
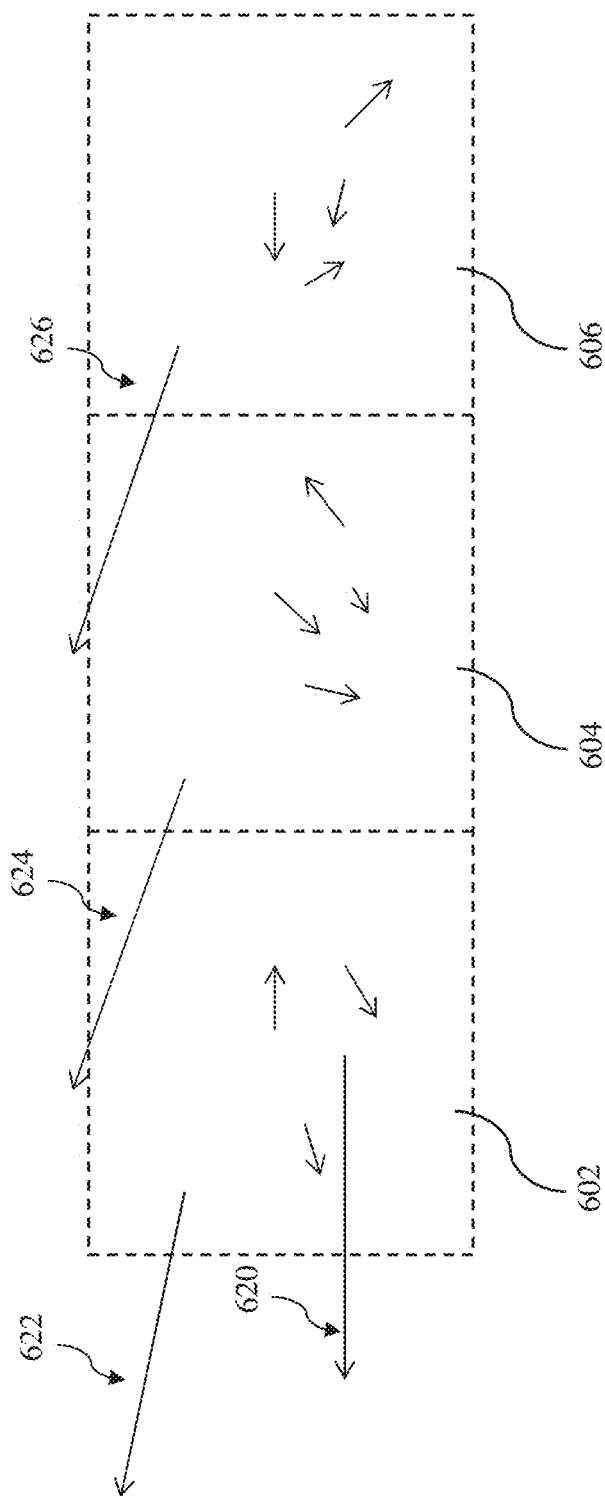
FIG. 6 shows a portion of a wafer map containing outliers among overlay error vectors.

FIG. 6 illustrates a portion of a wafer map consisting of three consecutive fields 602, 604, and 606. Each field has a plurality of overlay error vectors, among which there are outliers. Step 206 may identify vectors 620 and 622 in field 602, vector 624 in field 604, and vector 626 in field 606 as outliers. But, these outliers may not all be noise. Vectors 622, 624, and 626 appear to be periodically appearing in similar regions in these fields, which may be caused by some systematic imperfections. Therefore, vectors 622, 624, and 626 may be reticle effect data instead of noise, while vector 620 may be considered as a noise.

Step 208 is configured to separate reticle effect data from outliers determined in step 206 by applying at least an inter-field filtering to examine an overlay data's reoccurrence in a plurality of fields.

The appearance of overlay errors due to reticle effects can be attributed to both inter-field overlay errors and intra-field overlay errors. As discussed above, a "field" refers to an exposure field on a wafer each time machine-alignment is required. The inter-field overlay error can be resulted from inter-field translation, inter-field symmetrical and asymmetrical magnification, and inter-field symmetrical and asymmetrical rotation, such as mismatching problem between mask and wafer. Inter-field correction can be generated by applying an inter-field correction model. Inter-field correction compensates for wafer level deviation from a reference location (usually to the center of the wafer). Thus, the inter-field correction can include a combination of one or more of the group consisting of translations, rotations, scaling, and non-orthogonality. The inter-field correction applied to each field may be different, and can be computed as a linear function of the location of each field on the wafer. In some embodiments, the inter-field correction model is given by:

$$D_X = T_X - (RW+N) \cdot Y + S_X \cdot X + \text{higher order terms}$$

$$D_Y = T_Y + RW \cdot X + S_Y \cdot Y + \text{higher order terms} \quad \text{eq (2)}$$

where:

(X,Y) are inter-field coordinate system, with respect to the center of the wafer, $D_X$, $D_Y$ are inter-field overlay errors, $T_X$, $T_Y$ are inter-field translations, RW is wafer rotation, N is non-orthogonality and $S_X$, $S_Y$ are wafer scaling coefficients.

The intra-field overlay error can be resulted from intra-field translation, intra-field symmetrical and asymmetrical magnification, and intra-field symmetrical and asymmetrical rotation, such as misalignment between a light source filter lens and a mask. An intra-field error is measured with respect to the center of an exposure field. Intra-field correction can be generated by applying an intra-field correction model to each exposure field. In some embodiments, the intra-field correction model is given by:

$$dx = T_x - (RS+RA) \cdot y + (MS+MA) \cdot x + \text{higher order terms}$$

$$dy = T_y + (RS-RA) \cdot x + (MS-MA) \cdot y + \text{higher order terms} \quad \text{eq (3)}$$

where:

(x,y) are intra-field coordinate system, with respect to the center of a field, dx, dy are intra-field overlay errors, $T_x$, $T_y$ are intra-field translations, RS, RA are symmetrical and asymmetrical field rotations, and MS, MA are symmetrical and asymmetrical field magnifications.

To identify reticle effect data, a filtering process that includes using an inter-field correction model, an intra-field correction model, or a combination thereof may be applied. An overlay data is considered a reticle effect data if the difference (denoted as "residue") between the corresponding overlay error (denoted as "R") and a value calculated by correction model(s) is less than a threshold ($K_c$). For example, if the filtering process uses both an inter-field correction model and an intra-field correction model, an inter-field correction value is calculated for an overlay data according to the inter-field correction model and an intra-field correction value is calculated according to the intra-field correction model. The overlay data's residue is thereby the difference between "R" and a sum of the inter-field correction value and the intra-field correction value. This calculation may involve vector operations. The determination of a reticle effect data can be indicated as follows:

$$\text{residue} = |R - (\text{Inter-field correction value} + \text{Intra-field correction value})| <= K_c \quad \text{eq (4)}$$

where:

$K_c = 1$ nm~7 nm in some embodiments.

In some embodiments, the inter-field correction model is a correction per exposure (CPE) model. CPE allows different corrections to be provided for different fields patterned by a scanner. In some embodiments, the intra-field correction model is an intra-field high order process correction (iHOPC) model. The iHOPC model allows to model data with a high order polynomial model, including second order, third order or even higher order terms. Those higher order terms are non-linear. In one embodiment, the iHOPC model has an order selected from 2 to 5. Step 208 compares magnitude corresponding to each overlay data using equation (4) and thereby determines a set of reticle effect data. Accordingly, a set of non-reticle effect data is also determined with overlay data not satisfying equation (4).

Still referring to FIG. 2, the operation 205 includes a step 209. Step 209 examines whether an outlier identified in step 206 is actually identified as a reticle effect data in step 208. If the answer is yes, then this outlier has physical meanings corresponding to real systematic imperfections and should not be flagged as noise. If the answer is no, then this outlier should be regarded as noise and be excluded from further operations. The method 200 proceeds to operation 210 which groups overlay data that are not identified as noise into a set of filtered overlay data. Equivalently, the set of filtered overlay data includes outliers that are also identified as reticle effect data together with the non-outliers. Identifying noise from outliers can be performed in each field or on a wafer level collectively.

With noise removed, the set of filtered overlay data has higher accuracy and reliability in representing overlay errors. A second round of outlier filtering may be optionally applied to the whole set of filtered overlay data for finer noise reduction. The present embodiment includes an operation 212, which applies an inter-field correction model to further filter outliers. In this step, an inter-field correction value is calculated for each overlay data according to the inter-field correction model. An overlay data is considered as an outlier if its residue as the difference between "R" and the respective inter-field correction value is larger than a threshold ($K_r$). This calculation may involve vector operations. The determination of extra outliers can be indicated as follows:

$$\text{residue} = |R - \text{inter-field correction value}| > K_r \quad \text{eq (5)}$$

where:

$K_r = 3$ nm~7 nm in some embodiments.

In some embodiments, the inter-field model is a high order process correction (HOPC) model with an order equal to or less than 5. HOPC model allows a higher order inter-field process correction. The higher order terms are non-linear. The outliers identified in the second round of outlier filtering are also considered as noise and excluded from the set of filtered overlay data.

Still referring to FIG. 2, the method 200 proceeds to an operation 214 by determining overlay compensation according to the set of filtered overlay data using an alignment model. The operation 214 includes various actions (sub-operations), leading to the determination of the overlay compensation.

The alignment model is built up through a proper procedure. In some embodiments, the procedure includes selecting the compensation parameters, constructing a mathematical formula having the compensation parameters as a function of the overlay errors (or some extracted variables of the overlay errors), and determining the coefficients of the formula according to manufacturing data. In some embodiments, the alignment model is a hybrid model that includes an inter-field model and an intra-field model. For example, a CPE model and an iHOPC model, alternatively a HOPC model and an iHOPC model.

Still referring to FIG. 2, the method 200 includes an operation 216 by performing a compensation process to the patterning tool 106 according to the overlay compensation determined in the operation 214. During the operation 216, the patterning tool (such as a lithography system) 106 is adjusted according to the overlay compensation. Parameters including clamping force, tilting angle, translational shift, rotational shift of the wafer stage, and/or other various lithography exposing settings can be adjusted. In some embodiments, the projection module 158 is adjusted. In some other embodiments, the wafer stage 162 is additionally or alternatively adjusted. In some other embodiments, other module of the lithography system is included in the alignment model and the compensation process. For example, mask stage 166 may be included in the alignment model and the compensation process. In a more particular example, the clamping force or tilting angle of the mask stage 166 may be compensated. By the operation 216, the patterning tool 106 is corrected to reduce the overlay errors in a feed forward manner. For example, the overlay compensation is determined based on the overlay data from the current wafer, and subsequent exposing processes with the corrected system can be applied to the same wafer or alternatively another wafer.

The present disclosure provides a method for a patterning process with overlay monitoring and correction, where the overlay compensation is determined according to the predetermined overlay errors and is applied to compensate the patterning system to enhance the overlay compensation accuracy. The overlay compensation accuracy is enhanced by identifying and filtering noise from overlay metrology data. The noise reduction procedure includes the applying of both inter-field and intra-field filtering models.

The embodiments of the present disclosure offer advantages over existing art, though it is understood that other embodiments may offer different advantages, not all advantages are necessarily discussed herein, and that no particular advantage is required for all embodiments. By utilizing the disclosed method, the full mapping and intra-field high order process correction are achieved without decreasing the throughput of the lithography exposing process. The method also provides dynamic feed forward control to reduce overlay errors, enhancing the overlay quality wafer by wafer and lot by lot.

Thus, the present disclosure provides a method in accordance with some embodiments. The method includes patterning a substrate by a patterning tool; collecting a plurality of overlay errors from a plurality of fields on the substrate; identifying noise from the plurality of overlay errors by applying a first filtering operation and a second filtering operation that is different from the first filtering operation; grouping the plurality of overlay errors that are not identified as noise into a set of filtered overlay errors; calculating an overlay compensation based on the set of filtered overlay errors; and performing a compensation process to the patterning tool according to the overlay compensation.

The present disclosure also provides a method for overlay monitoring and control in accordance with some other embodiments. The method includes forming patterns on a wafer by a lithography system; collecting an overlay error set from the patterns, wherein the overlay error set includes a plurality of overlay error subsets according to a field scheme of the wafer; identifying outliers from each of the plurality of overlay error subsets; identifying noise from the outliers by applying a first inter-field correction model and an intra-field correction model; forming a filtered overlay error set by excluding the noise from the overlay error set; removing extra noise from the filtered overlay error set by applying a second inter-field correction model; after the removing of the extra noise, generating an overlay compensation from the filtered overlay error set; and adjusting at least one parameter of the lithography system according to the overlay compensation.

The present disclosure provides a system for patterning and overlay control in accordance with some embodiments. The system includes a patterning tool configured to form patterns on a wafer; a metrology tool configured to measure overlay errors associated with the patterns in each field of the wafer; and a controller module configured to read the overlay errors from the metrology tool, generate an overlay compensation, and feed the overlay compensation to the patterning tool to adjust a parameter of the patterning tool. The generation of the overlay compensation includes identifying noise from the overlay errors by applying at least two filtering operations; grouping the overlay errors that are not identified as noise into a set of filtered overlay errors; removing extra noise from the set of filtered overlay errors by applying another filtering operation that is different from the at least two filtering operations; and after the applying of the another filtering operation, calculating the overlay compensation from the set of filtered overlay errors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a metrology tool configured to collect overlay errors from a patterned substrate; and
a controller module coupled to the metrology tool and configured to generate an overlay compensation from the collected overlay errors, wherein the generating of the overlay compensation includes:
identifying a portion of the overlay errors as a set of outliers;
identifying inside the set of outliers overlay errors not due to reticle effects, thereby creating a set of noise;
excluding the set of noise from overlay errors, thereby creating a set of filtered overlay errors; and
calculating the overlay compensation based on the set of filtered overlay errors.

2. The system of claim 1, further comprising:
a patterning tool configured to form the patterned substrate, wherein the controller module is configured to feed the overlay compensation to the patterning tool to adjust at least one parameter of the patterning tool associating with the forming of the patterned substrate.

3. The system of claim 1, wherein the identifying of the set of outliers includes creating a wafer map on which the overlay errors are depicted as vectors with magnitude and direction.

4. The system of claim 3, wherein the identifying of the set of outliers includes dividing the wafer map into multiple fields and identifying the outliers field-by-field.

5. The system of claim 3, wherein the identifying of the set of outliers includes detecting an abrupt change in the magnitude of the vectors with reference to a reference magnitude.

6. The system of claim 1, wherein the creating of the set of noise includes dividing the overlay errors into multiple fields and applying at least an inter-field filtering to the overlay errors.

7. The system of claim 6, wherein the fields are based on an exposure field scheme during a lithography process in forming the patterned substrate.

8. The system of claim 6, wherein the inter-field filtering includes applying a correction-per-exposure (CPE) model.

9. The system of claim 1, wherein the generating of the overlay compensation further includes:
identifying and removing extra noise from the set of filtered overlay errors, prior to the calculating of the overlay compensation.

10. The system of claim 9, wherein the identifying of the extra noise includes applying an inter-field filtering to the set of filtered overlay errors.

11. A system for overlay control, the system comprising:
a metrology tool configured to measure overlay errors associated with patterns formed on a wafer; and
a controller module configured to read the overlay errors from the metrology tool and generate an overlay compensation, wherein the generation of the overlay compensation includes:
identifying noise from the overlay errors by applying at least two filtering operations;
grouping the overlay errors that are not noise identified by applying the at least two filtering operations into a set of filtered overlay errors; and
calculating the overlay compensation from the set of filtered overlay errors.

12. The system of claim 11, wherein the identifying the noise from the overlay errors includes dividing the overlay errors into multiple fields, and wherein the at least two filtering operations are selected from a ranking model applied to each field individually, an intra-field correction model applied to each field individually, and an inter-field correction model applied to the multiple fields collectively.

13. The system of claim 12, wherein the identifying of the noise from the overlay errors includes:
determining outliers from the overlay errors by applying the ranking model;
determining overlay errors due to reticle effects by calculating residues according to a difference between a magnitude of each overlay error and a sum of a first value generated by the inter-field correction model and a second value generated by the intra-field correction model; and
identifying the outliers that are not overlay errors due to reticle effects as noise.

14. The system of claim 12, wherein the inter-field correction model is a correction-per-exposure (CPE) model and the intra-field correction model is an intra-field high order process correction (iHOPC) model.

15. The system of claim 11, wherein the generation of the overlay compensation further includes:
removing extra noise from the set of filtered overlay errors by applying another filtering operation that is different from the at least two filter operations, prior to the calculating of the overlay compensation.

16. A method for overlay monitoring and control, the method comprising:
collecting an overlay error set from a wafer patterned by a lithography system, wherein the overlay error set includes a plurality of overlay error subsets according to a field scheme of the wafer;
determining outliers from each of the plurality of overlay error subsets by applying a ranking model to the corresponding overlay error subset;
identifying inside each of the plurality of overlay error subsets the outliers that are not due to reticle effects as noise inside the corresponding overlay error subset;
forming a filtered overlay error set by excluding the noise identified inside each of the plurality of overlay error subsets; and
generating an overlay compensation from the filtered overlay error set, wherein the overlay compensation is to adjust at least one parameter of the lithography system.

17. The method of claim 16, wherein the ranking model examines an abrupt change of magnitudes of overlay errors in each of the plurality of overlay error subsets.

18. The method of claim 16, wherein the ranking model is applied to a selected number of overlay errors but not all of the overlay errors in each of the plurality of overlay error subsets based on empirical knowledge.

19. The method of claim 16, wherein the identifying of the noise inside the corresponding overlay error subset includes computing residues based on a correction-per-exposure (CPE) model and an intra-field high order process correction (iHOPC) model.

20. The method of claim 19, wherein the iHOPC model has an order selected from 2 to 5.

* * * * *